United States Patent [19]
Satoh

[11] Patent Number: 6,034,890
[45] Date of Patent: Mar. 7, 2000

[54] SEMICONDUCTOR NONVOLATILE MEMORY DEVICE AND METHOD OF WRITING THERETO

[75] Inventor: Toshihiro Satoh, Higashikurume, Japan

[73] Assignee: Citizen Watch Co., Ltd., Tokyo, Japan

[21] Appl. No.: 09/233,921

[22] Filed: Jan. 21, 1999

[30] Foreign Application Priority Data

Jan. 22, 1998 [JP] Japan .................................... 10-010074
Jul. 30, 1998 [JP] Japan .................................... 10-215136

[51] Int. Cl.[7] .................................................... G11C 16/00
[52] U.S. Cl. ......................... 365/185.05; 365/63; 365/94
[58] Field of Search ...................... 365/185.18, 185.05, 365/63, 72, 94, 103, 104, 185.23; 257/390, 391

[56] References Cited

U.S. PATENT DOCUMENTS

| | | |
|---|---|---|
| 4,045,784 | 8/1977 | Mayumi et al. ......................... 365/104 |
| 5,438,542 | 8/1995 | Atsumi et al. ...................... 365/185.23 |
| 5,644,154 | 7/1997 | Spinella et al. .......................... 365/104 |
| 5,943,264 | 8/1999 | Fournel et al. ..................... 365/185.05 |

*Primary Examiner*—Tan T. Nguyen
*Attorney, Agent, or Firm*—Armstrong, Westerman Hattori, McLeland & Naughton

[57] ABSTRACT

A first device region is formed in a first well region provided on a semiconductor substrate and a second device region is formed in a second well region, both of which are separated by a field oxidation film, a memory transistor for writing a program is provided in the first device region, an address transistor controlling the writing is provided in the second device region, and a source region of the address transistor and a drain region of the memory transistor are connected by an interconnecting metal to structure a semiconductor nonvolatile memory device which can electrically perform writing only once.

13 Claims, 10 Drawing Sheets

6,034,890

SEMICONDUCTOR NONVOLATILE MEMORY DEVICE AND METHOD OF WRITING THERETO

BACKGROUND OF THE INVENTION

1. Field of the Invention

The present invention relates to a semiconductor nonvolatile memory device which can electrically write only once, especially a semiconductor nonvolatile memory device which performs writing of a program by breaking down a transistor, and a method of writing thereto.

2. Description of the Related Art

Generally, in a semiconductor integrated circuit, compensation or adjustment accompanied by dispersion compensation of a threshold voltage or change of operational condition of a transistor is required to improve the yield rate and stabilize the quality.

In an electronic timepiece (watch or clock), by oscillating a crystal resonator in an oscillation circuit provided in a complex circuit for the timepiece, a clock signal which is a standard of measuring time is generated. When a tuning-fork-type crystal resonator is used, some dispersion is created in the frequency of the clock signal due to a slight difference in size caused by the processing accuracy.

Thus, adjustment of a digital frequency by means of the circuit to raise an accuracy of a slightly dispersed clock signal generated from the oscillation circuit using the crystal resonator having an accuracy of one second level of a timepiece to an accuracy of ppm (part per million) is referred as DF adjustment.

The DF adjustment of the conventional timepiece will be explained with reference to FIG. 7 to FIG. 10.

A principle of the DF adjustment will be explained with circuit diagrams in FIG. 7 and FIG. 8, and a time chart in FIG. 9.

FIG. 7 is a block circuit diagram showing a structure of a conventional DF adjustment circuit. The circuit is defined by an oscillation circuit 23 using a crystal resonator 18, a dividing circuit 24, a DF adjustment timing circuit 25, a DF adjustment data reading circuit 26, a plurality of DF adjustment terminals 27, and a plurality of AND circuits 28.

The dividing circuit 24 is composed by a plurality of flip-flop circuits 29a to 29e (hereinafter, abbreviated to FF circuit).

In the drawing, the solid arrow line indicates the DF adjustment data reading signal Sa, a broken arrow line indicates a DF adjustment data signal Sb, and a dashed arrow line shows an input and output direction to each circuit of the DF adjustment timing signal Sc, respectively.

FIG. 8 shows a concrete example of the circuit diagram of the DF adjustment data reading circuit 26 in FIG. 7. The DF adjustment data reading circuit 26 is composed by a plural number of invertors 33 and NOR circuits 34 in the same number thereof.

The electric source voltage $V_{DD}$ is inputted to each invertor 33 through each DF adjustment terminal 27 respectively, the reversal output by each invertor 33 is inputted to an input terminal on one side of each NOR circuit 34, the DF adjustment data reading signal Sa is inputted by commonly connecting the other input terminals of each NOR circuit 34, and the output terminal of each NOR circuit 34 is connected to an input side of each invertor 33. The output signal of each NOR circuit 34 is a DF adjustment data signal Sb.

FIG. 9 is a time chart of an output signal from the first FF circuit 29a to the fifth FF circuit 29e which constitute the dividing circuit 24 in relation to the DF adjustment data reading signal Sa and the DF adjustment timing signal Sc shown in FIG. 7.

In FIG. 9, T1 indicates the timing when the DF adjustment data reading signal Sa changed to a high level "H", and T2 indicates the timing when the DF adjustment data reading signal Sa changed to a low level "L", respectively. In addition, T3 indicates the timing when the DF adjustment timing signal Sc is set to a high level "H".

In FIG. 7, an output signal of the oscillation circuit 23 is inputted to the first FF circuit 29a constituting part of the dividing circuit 24, and operation of the dividing circuit 24 starts.

At the timing T1 in FIG. 9, the DF adjustment timing circuit 25 receives the output signal of the dividing circuit 24, and outputs the DF adjustment data reading signal Sa which is usually in a level of "L", for several milliseconds in a level of "H".

When the DF adjustment data reading signal Sa is "H", all output signals of all NOR circuits 34, which constitute the DF adjustment data reading circuit 26 shown in FIG. 8, become "L".

At this time, when the signal from each DF adjustment terminal 27 is in a level of "H" corresponding to the electric source voltage $V_{DD}$, pulling of electric potentials against each other occurs between the output of each NOR circuit 34 and each DF adjustment terminal 27, and the input signal of each invertor 33 and the output signal of each NOR circuit 34 is changed to a level of "H", while the output signal of each invertor 33 changed to a level of "L".

When the DF adjustment data reading signal Sa becomes "L" at the timing T2 in FIG. 9, since two input signals of each NOR circuit 34 in FIG. 8 as well as the output signal of the invertor 33 becomes "L", the output signal of each NOR circuit 34 becomes "H".

However, if any one of plural DF adjustment terminals 27 is selectively cut, the pulling of electric potentials against each other does not occur between the output signal of the NOR circuit 34 which connects with the above described cut DF adjustment terminal 27, and the DF adjustment terminal 27. Accordingly, while the DF adjustment data reading signal Sa is in a "H" state, the output signal of the NOR circuit 34 is "L" and the output of the invertor 33 is "H".

Even when the output of the DF adjustment data reading signal Sa becomes "L" at the timing T2 in FIG. 9, since the input signals into the NOR circuit 34 are "L" and "H", the output signal of the NOR circuit 34 remains in a "L" state.

In other words, when the output signal of the NOR circuit 34 is required to remain in a "L" state, it can be realized by only cutting the DF adjustment terminal 27 corresponding to the NOR circuit 34 needed.

The output signal of each NOR circuit 34 in the DF adjustment data reading circuit 26 becomes a DF adjustment data Sb, which is inputted to each AND circuit 28 shown in FIG. 7.

The DF adjustment timing circuit 25 in which the DF adjustment data reading signal Sa is again changed to "L" from "H" at the timing T2 shown in FIG. 9 makes the DF adjustment timing signal Sc, which is usually in a "L" state, be in a "H" state only in a moment at the timing of T3 shown in FIG. 9, thereby the output signal of the AND circuit 28 becomes "H" only in a moment when the DF adjustment timing signal Sc becomes "H", if the DF adjustment data Sb is "H".

At this time, all output signals of the FF circuits 29a to 29e constituting the dividing circuit 24 are in a "L" state, only a FF circuit 29 corresponding to the AND circuit 28 in which the output signal is in a "H" state has an output signal in a "H" state, and the dividing circuit 24 moves a little faster than the actual. Thus, it is possible to perform the digital frequency adjustment of the clock signal through the circuits.

Next, writing of the DF adjustment data will be explained with reference to FIG. 10. FIG. 10 is a schematic plane view showing a conventional complex circuit for a timepiece.

The complex circuit of a timepiece consists of a DF adjustment terminal 27, IC 36, and a crystal resonator 18 provided on a complex circuit substrate 35. In FIG. 10, a white circle portion 38 indicates a hole opened so as to cut the DF adjustment terminal 27 by a cutting means such as a drill.

Judgement of the DF adjustment data is determined by checking whether any one of a data signal connecting to the DF adjustment terminal 27 and a data signal without connecting to the DF adjustment terminal 27 is inputted or not, that is, whether from any one of plural DF adjustment terminals 27 the signal by the electric source voltage $V_{DD}$ is inputted to the IC 36 or not.

Consequently, by cutting the DF adjustment terminal 27 shown in FIG. 10 with a cutting means such as a drill, the corresponding DF adjustment data Sb is changed to a "L" state, while by not cutting the DF adjustment terminal 27, the corresponding DF adjustment data Sb has a "H" state.

Thus, in the complex circuit for a timepiece (watch and clock) shown in FIG. 10, the DF adjustment is performed by setting the DF adjustment terminals 27 by the same number of the DF adjustment data, and by cutting only a DF adjustment terminal 27 to which a program is to be written in, with a mechanical cutting means such as a drill.

In order to carry out the writing of a program through this method, input/output terminals for this purpose are required to be provided on the IC 36 in the same number as the DF adjustment terminals 27.

Since the input/output terminal has an area of 100 $\mu$m² per piece, if the same number of input/output terminals and DF adjustment terminals are provided on the IC 36, the area of the IC 36 needs to be very large.

When the area of the IC 36 gets large, the ratio of the area occupied by the IC on the complex circuit board 35 becomes high, and at the same time the area efficiency in relation to wafer area decreases and number of IC tips obtainable from a sheet of wafer becomes small.

Furthermore, since the writing of a program is performed by a mechanical cutting means such as a drill, it takes a long period of time for the processing.

SUMMARY OF THE INVENTION

The present invention is carried out to solve the above described disadvantages, and the objects of the present invention are to provide a semiconductor nonvolatile memory device which is excellent in area efficiency, suitable for performing DF adjustment of a clock signal in a complex circuit for a timepiece (watch or clock), capable of electrically writing a program only once, and a method of writing a program thereto.

Therefore, the semiconductor nonvolatile memory device according to the present invention comprises a first well and second well on the same face side of a semiconductor substrate, which are separated by a field oxidation film provided on the semiconductor substrate; a first device region formed in the first well region and a second device region formed in the second well region; a memory transistor for writing a program provided in the first device region; and an address transistor for controlling the writing of the memory transistor provided in the second device region. A source region of the address transistor and a drain region of the memory transistor are connected by an interconnecting metal.

It is advisable to make the surface impurity concentration of the first well higher than the surface impurity concentration of the second well.

It is also advisable to make the channel area of a gate electrode of the above described memory transistor smaller than the channel area of a gate electrode of the address transistor.

For such a purpose, it is necessary to make the channel width of the gate electrode of the above described memory transistor narrower than the channel width of the gate electrode of the address transistor, or to make the channel length of the gate electrode of the above described memory transistor shorter than the channel length of the gate electrode of the address transistor.

The above described memory transistor may connect the gate electrode and the source region with the interconnecting metal.

The method of writing to the semiconductor nonvolatile memory device according to the present invention is performed in such a manner that the writing of a program is conducted only once by electrically breaking down the memory transistor in the above described semiconductor nonvolatile memory device.

Accordingly, it is advisable to pass a current, in the range larger than the saturation current value but not so large as to break down the address transistor, through the above described address transistor at the time of writing a program.

Alternatively, the writing of a program can be performed only once by simultaneously applying the same voltage on the gate electrode of the memory transistor and the gate electrode of the address transistor of the above described nonvolatile memory device to electrically break down the memory transistor.

The above and other objects, features and advantages of the invention will be apparent from the following detailed description which is to be read in conjunction with the accompanying drawings.

DETAILED DESCRIPTION OF THE PREFERRED EMBODIMENTS

The preferred embodiments of the present invention will be explained in detail with reference to the drawings hereinafter.

In the embodiments of the present invention shown below, the device has a hybrid-element device consisting of a memory transistor and an address transistor, both being n-type MOS transistors, as a semiconductor nonvolatile memory device, and a method of writing thereto will be explained.

Figure 1:
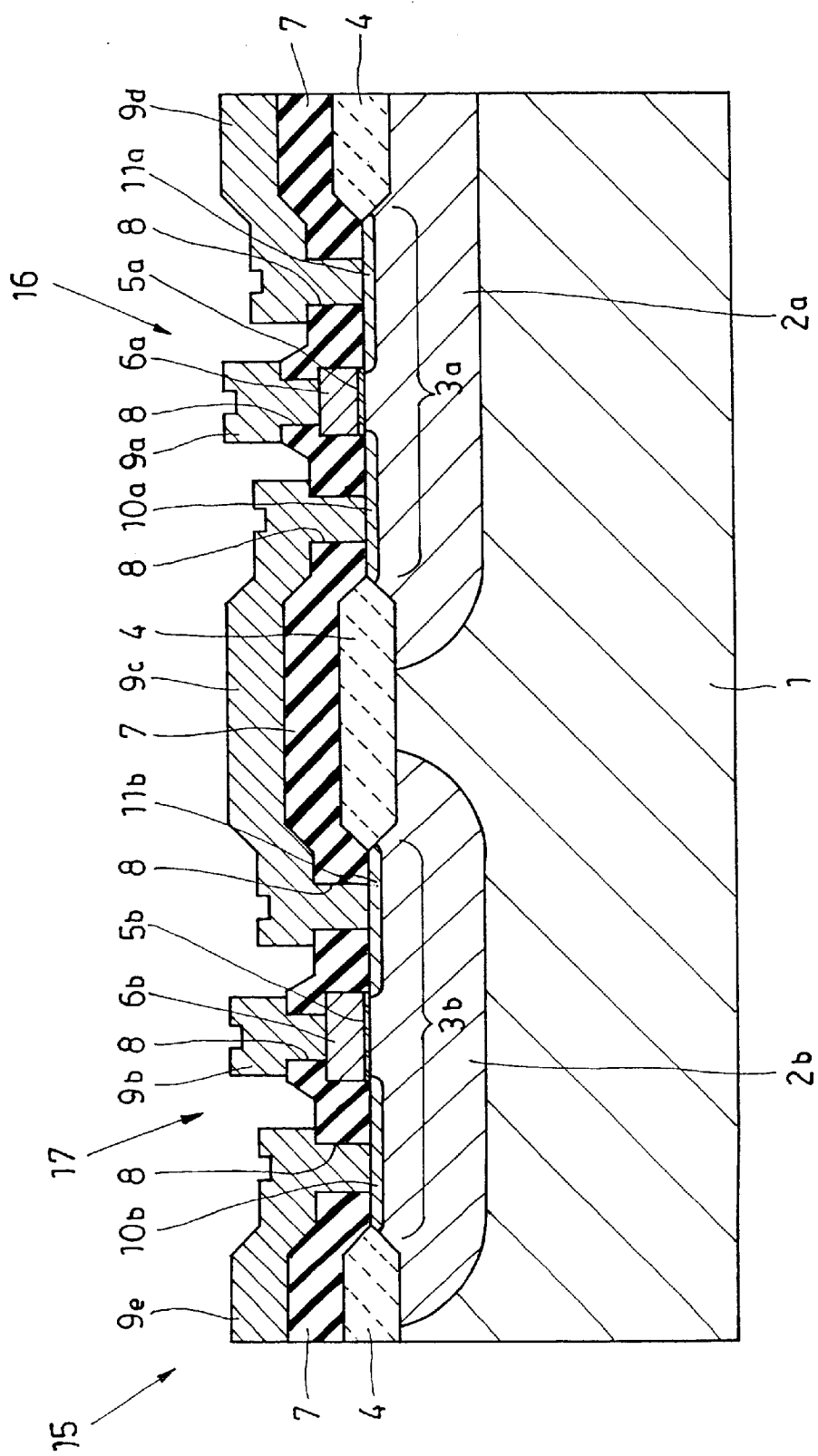
FIG. 1 is a schematic cross sectional view showing a structure of a first embodiment of a semiconductor nonvolatile memory device according to the present invention.
Figure 2:
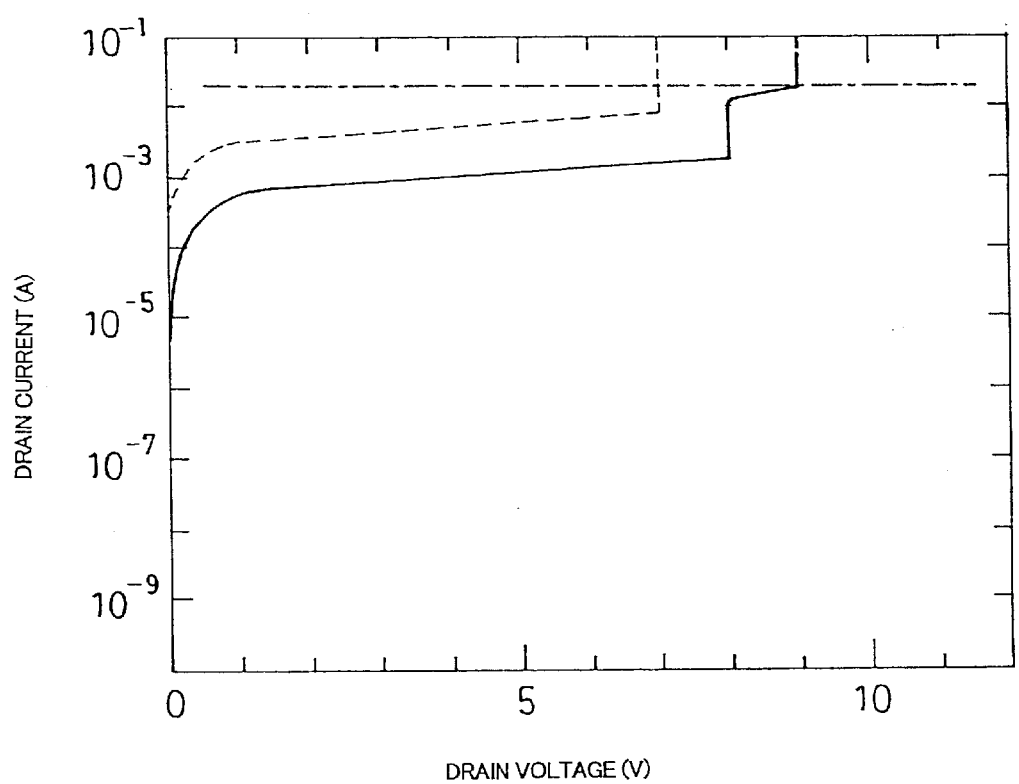
FIG. 2 is a diagram showing the relationship of drain voltage and drain current in a memory transistor and an address transistor which constitute the semiconductor nonvolatile memory device shown in FIG. 1.
Figure 3:
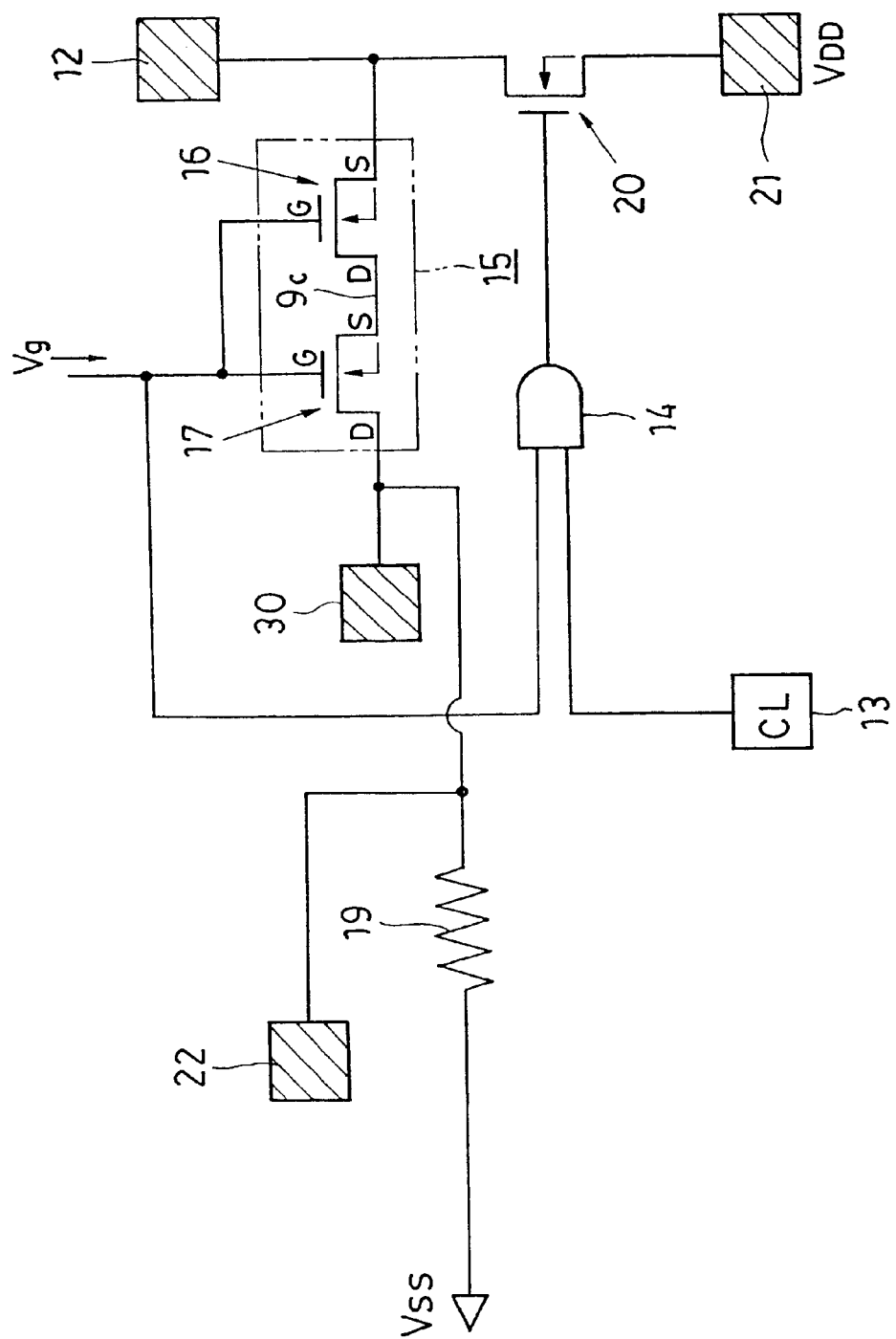
FIG. 3 is a circuit structure showing an outline of the method of controlling the semiconductor nonvolatile memory device shown in FIG. 1.

First embodiment: FIG. 1 to FIG. 3

FIG. 1 is a schematic cross sectional view showing the first embodiment of the semiconductor nonvolatile memory device according to the present invention, and the structure of the semiconductor nonvolatile memory device will be explained with reference to this drawing.

The semiconductor nonvolatile memory device 15 shown in FIG. 1 is provided with a first P-well 2a and a second P-well 2b, both of which conduction types are of p-type, on the same face side of a semiconductor substrate 1, and a first device region 3a and a second device region 3b are separately arranged by a field oxidation film 4 in the first P-well 2a region and in the second P-well 2b region respectively.

It is advisable to make the surface impurity concentration of the first well 2a thicker than the surface impurity concentration of the second well 2b.

Gate oxidation films 5a and 5b are formed in the first and second device regions 3a and 3b respectively. A first gate electrode 6a which has the channel length in the transistor region of 1.2 $\mu$m and the channel width in the transistor region of 10 $\mu$m is provided on the gate oxidation film 5a of the first device region 3a, and a second gate electrode 6b which has the channel length in the transistor region of 1.6 $\mu$m and the channel width in the transistor region of 40 $\mu$m is provided on the gate oxidation film 5b of the second device region 3b.

Furthermore, drain regions 10a and 10b and source regions 11a and 11b, all of which diffuse the n-type impurity, are formed in the first and second device regions 3a and 3b located on both sides of the gate electrodes 6a and 6b. A memory transistor 16 for writing programs is formed in the first device region 3a and an address transistor 17 which controls the writing into the memory transistor 16 is formed in the second device region 3b.

An interlayer insulator 7 is provided on the semiconductor substrate 1 on which the above described articles are formed, and contact holes 8 are formed at the positions corresponding to each of the gate electrodes 6a and 6b, the drain regions 10a and 10b, and the source regions 11a and 11b of the memory transistor 16 and the address transistor 17, and each of interconnecting metals 9a, 9b, 9c, 9d, and 9e is provided there.

In the semiconductor nonvolatile memory device 15, an independent interconnecting metal 9c connects the drain region 10a of the memory transistor 16 having the first gate electrode 6a provided on the first device region 3a, with the source region 11b of the address transistor 17 having the second gate electrode 6b provided on the second device region 3b.

Thus, a hybrid-element device in which the memory transistor 16 and the address transistor 17, both n-type MOS transistors, are connected in series is formed on other wells 2a and 2b provided in the same semiconductor substrate 1 to comprise the semiconductor nonvolatile memory device 15.

The channel width and the channel length of the gate electrode 6a of the memory transistor 16 are smaller than the channel width and the channel length of the gate electrode 6b of the address transistor 17. Thus, the channel area of the gate electrode 6a of the memory transistor 16 is made smaller than the channel area of the gate electrode 6b of the address transistor 17 so that the breakdown of the memory transistor 16 is facilitated.

The special characteristics of the memory transistor 16 and the address transistor 17 which comprise the semiconductor nonvolatile memory device 15 are shown in FIG. 2. It should be noted that "the gate electrode", "the drain region" and "the source region" explained with FIG. 1 are simply called by names of "the gate", "the drain" and "the source" in the description hereinafter.

FIG. 2 is a diagram showing changes of the drain current in relation to the drain voltage of each transistor in an on-state, that is a state in which a certain constant voltage is applied on the gate electrode, in the memory transistor 16 and the address transistor 17 of the semiconducter nonvolatile memory device 15 having a structure shown in FIG. 1.

In FIG. 2, the axis of abscissas indicates the drain voltage of the transistor and the axis of ordinates indicates the drain current. The solid line shows the drain current in relation to the drain voltage of the memory transistor 16, and the dotted line shows the drain current in relation to the drain voltage of the address transistor 17. The dashed line in FIG. 2 shows a level of the drain current at which the memory transistor 16 reaches the point of breakdown.

It should be noted that 3V of voltage is applied on both of the gate electrodes 6a and 6b of the memory transistor 16 and the address transistor 17.

As shown in FIG. 2, the change of the drain current in relation to the drain voltage applied on the drain of the memory transistor 16 shows a rapid increase of the drain current at the point where the drain voltage exceeds 8V.

However, it can be recognized that the drain current has resistance in the region exceeding 10 mA ($10^{-2}$ A) and the drain voltage reaching a complete breakdown is around 9V.

On the contrary, it can be confirmed that the change of the drain current in relation to the drain voltage applied on the drain of the address transistor 17 shows that when the drain voltage exceeds 7V, the drain current rapidly increases but does not reach breakdown at the drain current of around 100 mA.

From this observation, when the drain current is limited to be less than 100 mA, by applying voltage of about 10V on the drain of the address transistor 17 to supply a current of more than saturation current value, only the memory transistor 16 can be broken down without breakdown of the address transistor 17.

Thus, on writing a program, a current in a range of current exceeding the saturation current but not being large enough to cause the breakdown of the transistor is passed through the address transistor 17, so that it becomes unnecessary to have a saturation current characteristic corresponding to a drain current required for the memory transistor 16 to reach the breakdown, and the channel area of the gate electrode is not required to be made so large.

As a writing condition, the DF adjustment of a timepiece is carried out by applying the program voltage only once for about 100 msec of time on the semiconductor nonvolatile memory device.

In the semiconductor nonvolatile memory device 15 according to the present embodiment, it has been recognized that the characteristic of the address transistor 17 after the writing of the program as described above has been carried out does not have any special problem including the degradation of any property.

Next, a method of controlling the semiconductor nonvolatile memory device explained with FIG. 1 will be explained with reference to a circuit diagram in FIG. 3.

In the semiconductor nonvolatile memory device 15 according to the present embodiment, while the memory transistor 16 and the address transistor 17 are made on-state by applying the same voltage on both gates of the memory transistor 16 and the address transistor 17, a voltage required to break down the memory transistor 16 is applied on the drain of the address transistor 17 so that the memory transistor 16 is electrically broken down, thereby the writing of a program is performed only once.

FIG. 3 is a circuit block diagram showing a configuration of the semiconductor device which mounts the semiconductor nonvolatile memory device 15 shown in FIG. 1. The semiconductor nonvolatile memory device 15 is shown by surrounding with a two-dot chain line in the drawing. The numeral 12 indicates a grounding terminal, the numeral 21 indicates a read-only terminal, the numeral 22 is an output terminal, the numeral 30 indicates a write-only terminal, the numeral 13 is a clock terminal, the numeral 14 is an AND circuit, the numeral 19 is resistance for data reading, and the numeral 20 is a transistor switch for reading.

During program writing, no voltage is applied on the writing-only terminal 21, no clock signal is inputted into the clock terminal 13, and the transistor switch 20 for reading remains in an off-state. By applying the same voltage Vg of about 3V on the gate G of the memory transistor 16 and the gate G of the address transistor 17, both transistors are made on, while the grounding terminal 12 is earthed. Under this condition, voltage of about 10V required for writing a program is applied on the drain D of the memory transistor 16 from the writing-only terminal 30.

At this time, since the address transistor 17 is on, the voltage applied on the drain D is applied on the drain D of the memory transistor 16 through a interconnecting metal 9c shown in FIG. 1 from the source S, which allows the drain current of about 100 mA to pass through the memory transistor 16 to electrically break down the same, so that the writing of the program is carried out. The memory transistor 16 thus broken down is in a state of a short circuit between the drain and the source.

The value of the resistance 19 for data reading is set to be smaller than the sum of resistance values of the address transistor 17 and the transistor switch 20 for reading with a resistance value of the memory transistor 16 before breakdown, and larger than the sum of resistance values of the address transistor 17 and the transistor switch 20 for reading with a resistance value of the memory transistor 16 after the breakdown (the resistance value is about several Ω due to the short circuit state).

When confirming the memory transistor 16 being broken down, the grounding terminal 12 is set to be open and while voltage of about 1.5V, that is lower than the voltage value for writing a program, is applied on the gate G of the address transistor 17, voltage $V_{DD}$ is applied on the read-only terminal 21.

The voltage applied on the gate G of the address transistor 17 is also applied on an input terminal which is one of the input terminals of the AND circuit 14, and voltage is applied on the other input terminal by inputting a clock signal from the clock terminal 13. Accordingly, only when the clock signal is "H", the output of the AND circuit 14 becomes "H", and the transistor switch 20 for reading on whose gate the above described output is applied is made on, and the address transistor also becomes in an on-state.

As a result, pulling occurs between the potential on the address transistor 17 and the potential on the resistance 19 for data reading on one end of which voltage Vss (normally 0V) is applied.

If the memory transistor 16 is not broken down, the resistance value of the resistance 19 for data reading becomes smaller than the sum of the resistance values of the address transistor 17, the transistor switch 20 for reading and the memory transistor 16, which are in an on-state, and the voltage $V_{DD}$ applied on the read-only terminal 21 is never detected as a signal from the output terminal 22.

On the contrary, if the memory transistor 16 is broken down, the resistance value of the resistance 19 for data reading is larger than the sum of the resistance values of the address transistor 17 and the transistor switch 20 for reading in an on-state, and the resistance value of the memory transistor 16 in a broken down state. As a result, the voltage $V_{DD}$ applied on the read-only terminal 21 is detected as a signal from the output terminal 22.

Thus, whether the memory transistor 16 is broken down or not can be checked with a detected voltage from the output terminal 22 using a cycle of a clock signal inputted from the clock terminal 13.

It should be noted that when many semiconductor nonvolatile memory devices 15 in which the memory transistor 16 and the address transistor 17 are formed in series are provided, each of the terminals 12, 13, 21, 22, and 30 may be provided one each in common therewith.

Figure 7:
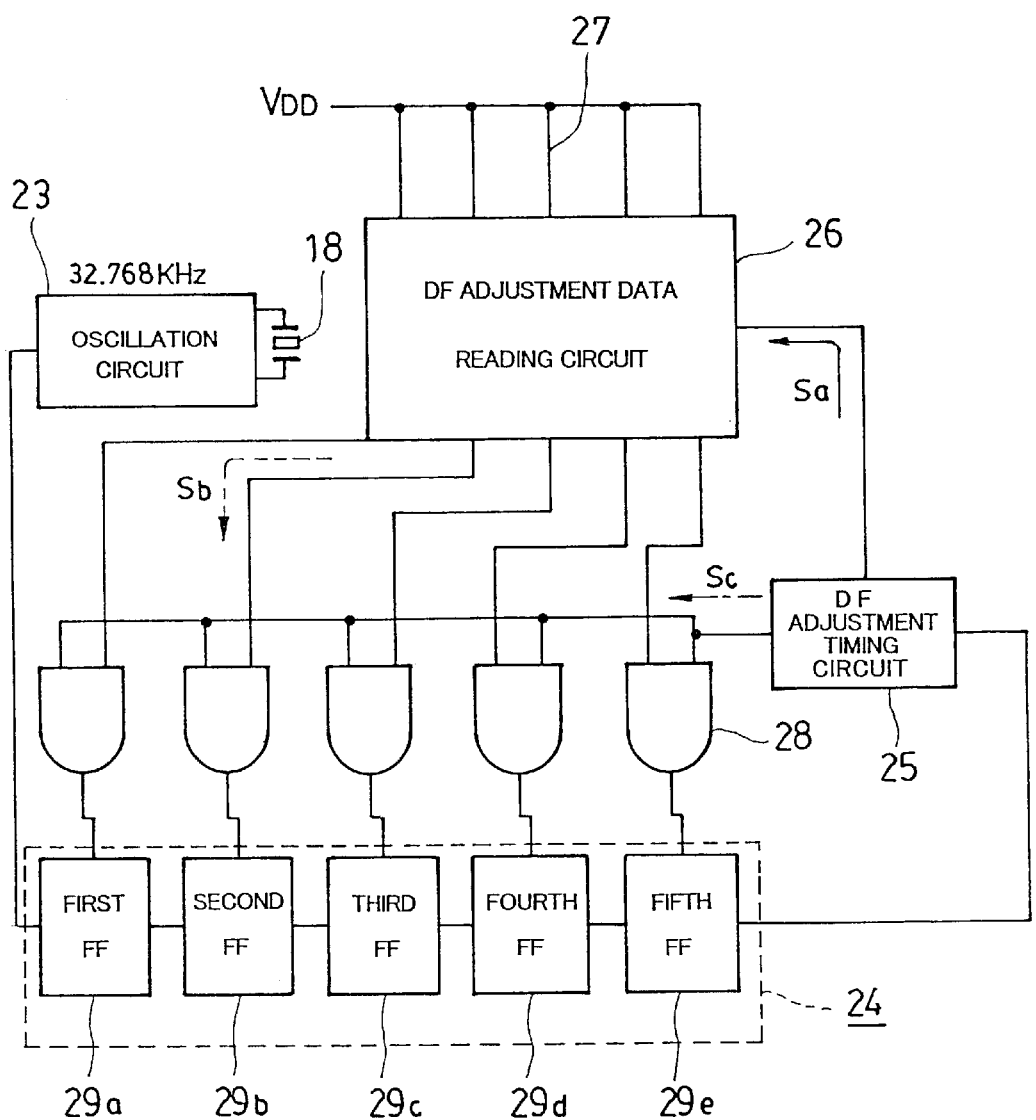
FIG. 7 is a block circuit diagram showing an example of a DF adjustment circuit in a conventional timepiece (watch and clock)
Figure 8:
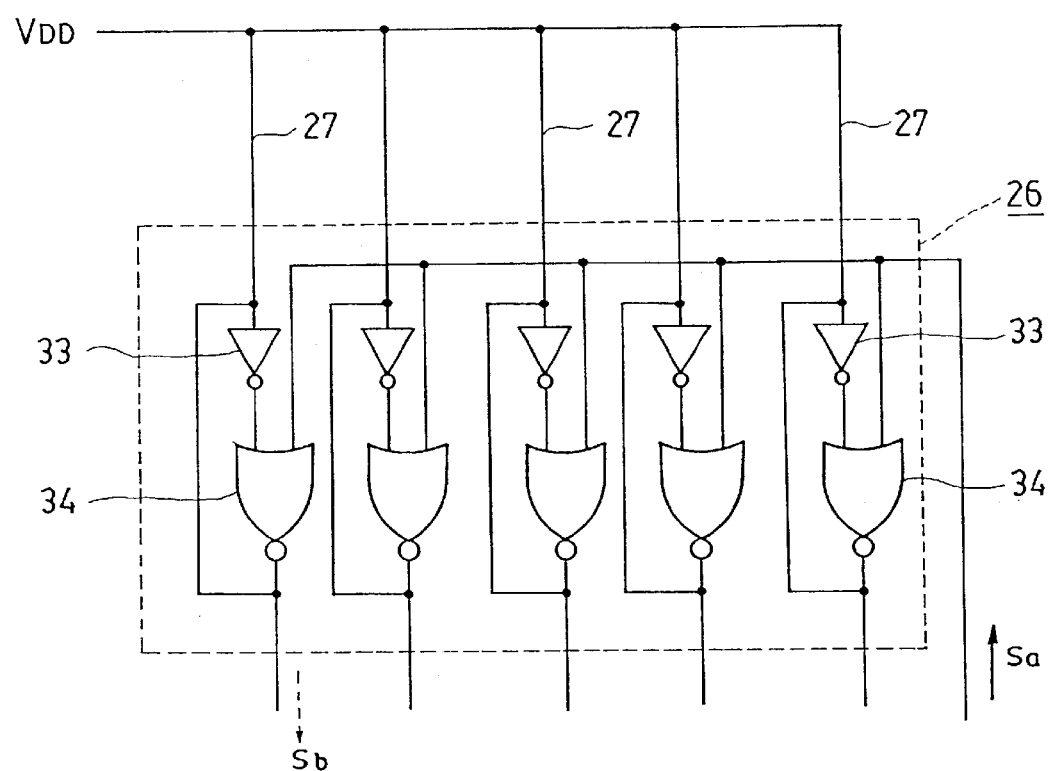
FIG. 8 is a circuit diagram showing a concrete example of the DF adjustment data reading circuit 26 in FIG. 7.
Figure 9:
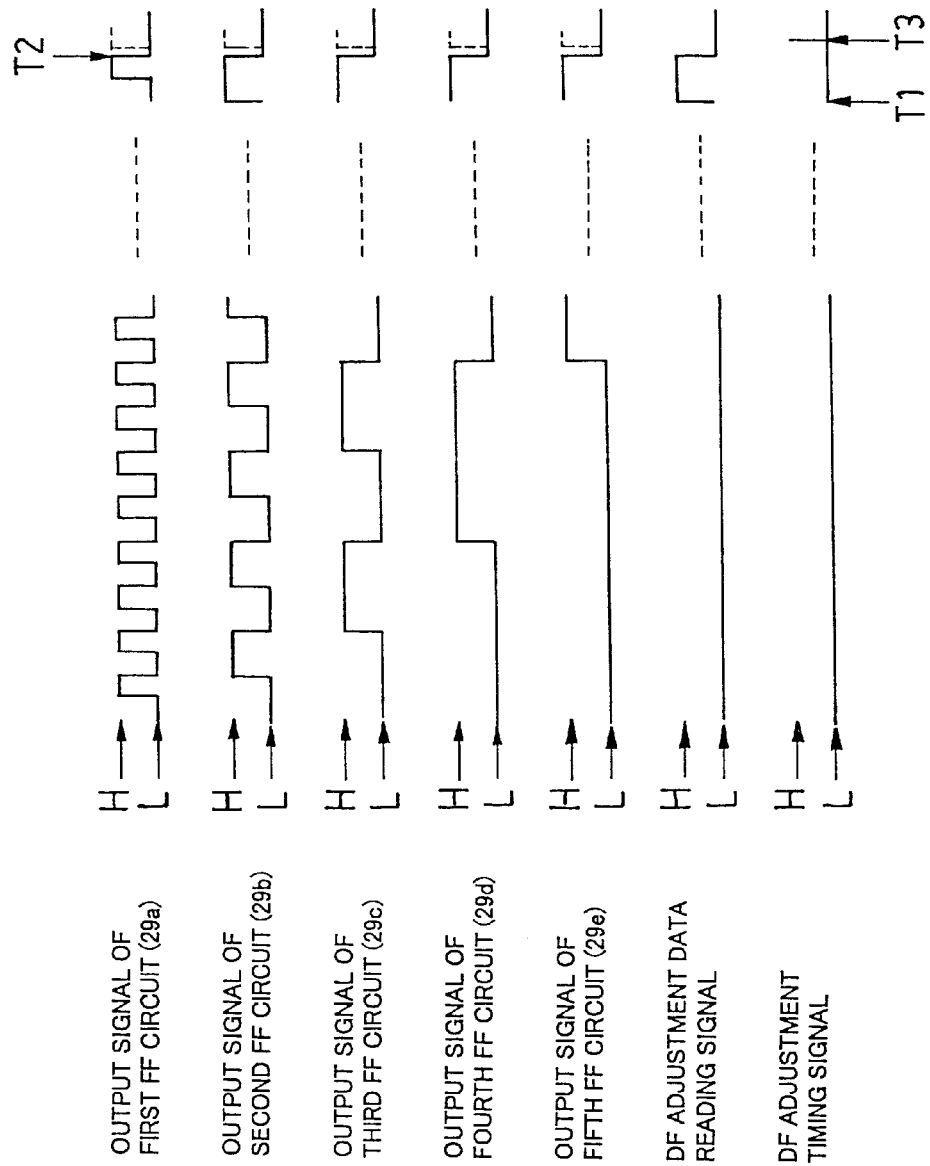
FIG. 9 is a time chart showing an output signal of each FF circuit which constitutes a dividing circuit in relation to a DF adjustment data reading signal and a DF adjustment timing signal in the DF adjustment circuit shown in FIG. 7.
Figure 10:
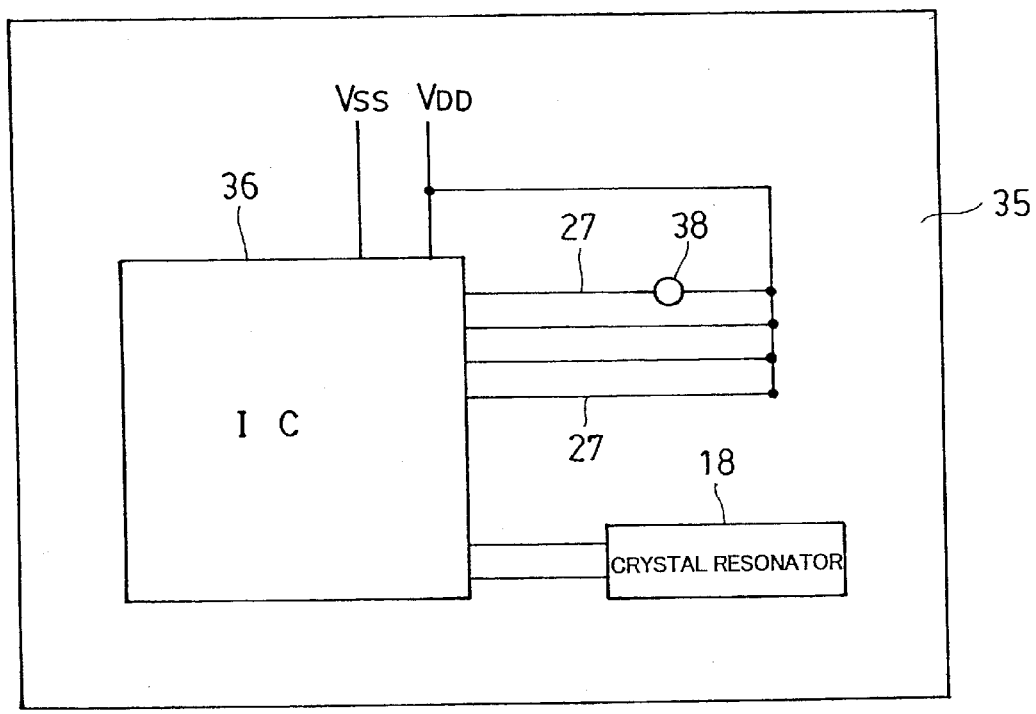
FIG. 10 is a schematic plane view showing an example of a conventional complex circuit for a timepiece (watch or clock).

A configuration of a DF adjustment circuit for the time when DF adjustment is carried out by mounting such a semiconductor nonvolatile memory device on the hybrid circuit IC 36 for a watch shown in FIG. 10, is different from those shown in FIG. 7 and FIG. 8, but since the resistance value between the drain and source is largely changed by the breakdown of the memory transistor, it is easy to carry out the DF adjustment using the same.

Figure 4:
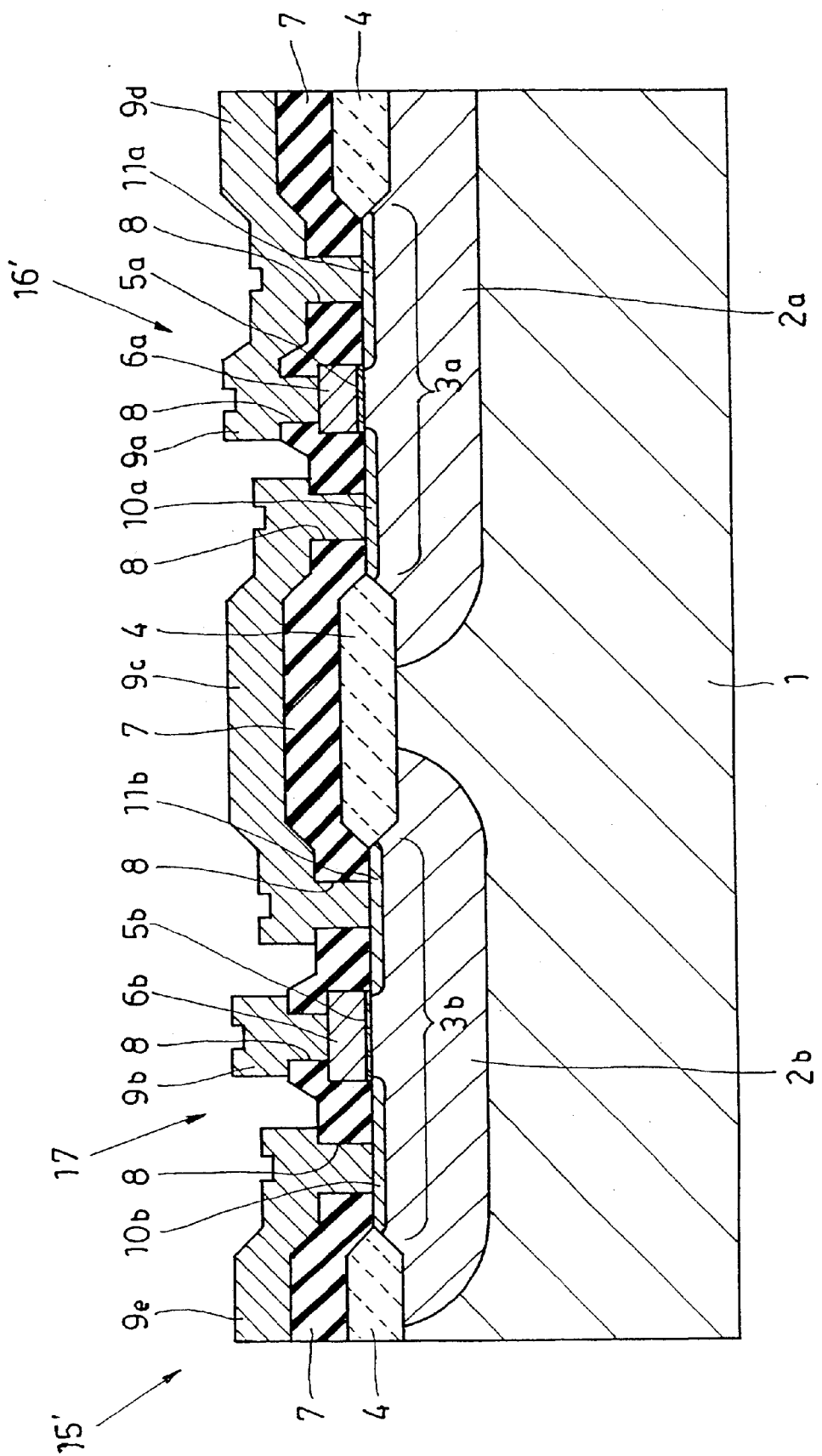
FIG. 4 is a schematic cross sectional view showing a structure of a second embodiment of a semiconductor nonvolatile memory device according to the present invention.
Figure 5:
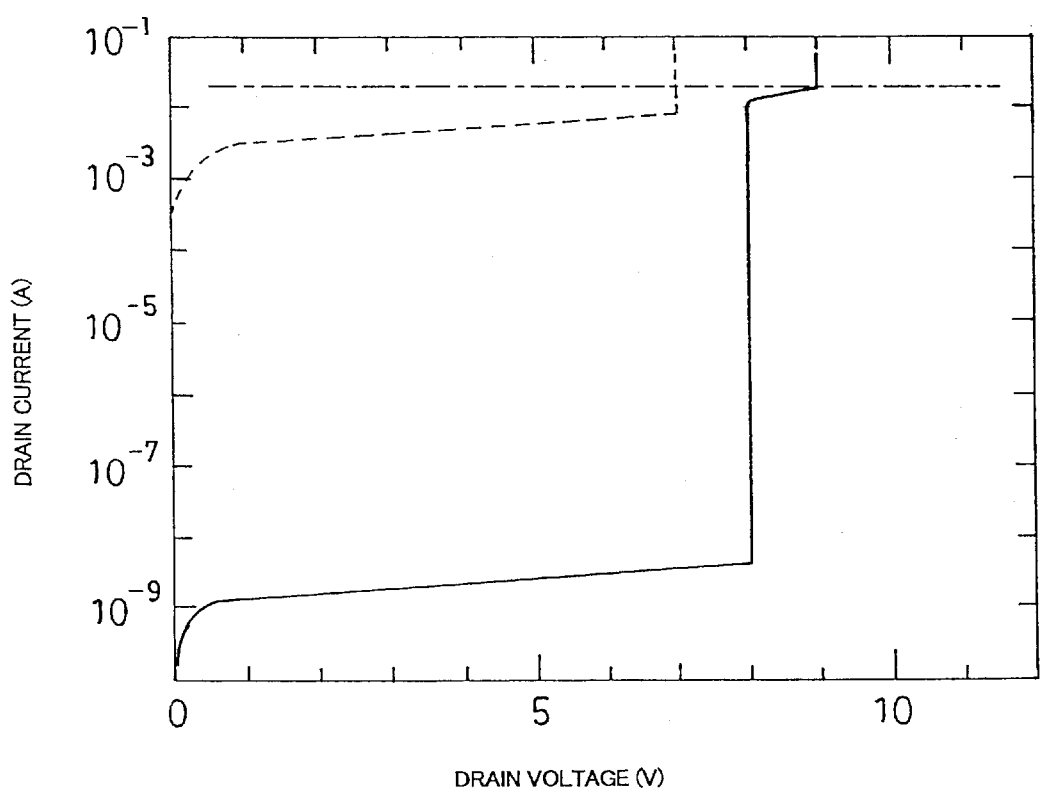
FIG. 5 is a diagram showing the relationship of drain voltage and drain current in a memory transistor and an address transistor which constitute the semiconductor nonvolatile memory device shown in FIG. 4.
Figure 6:
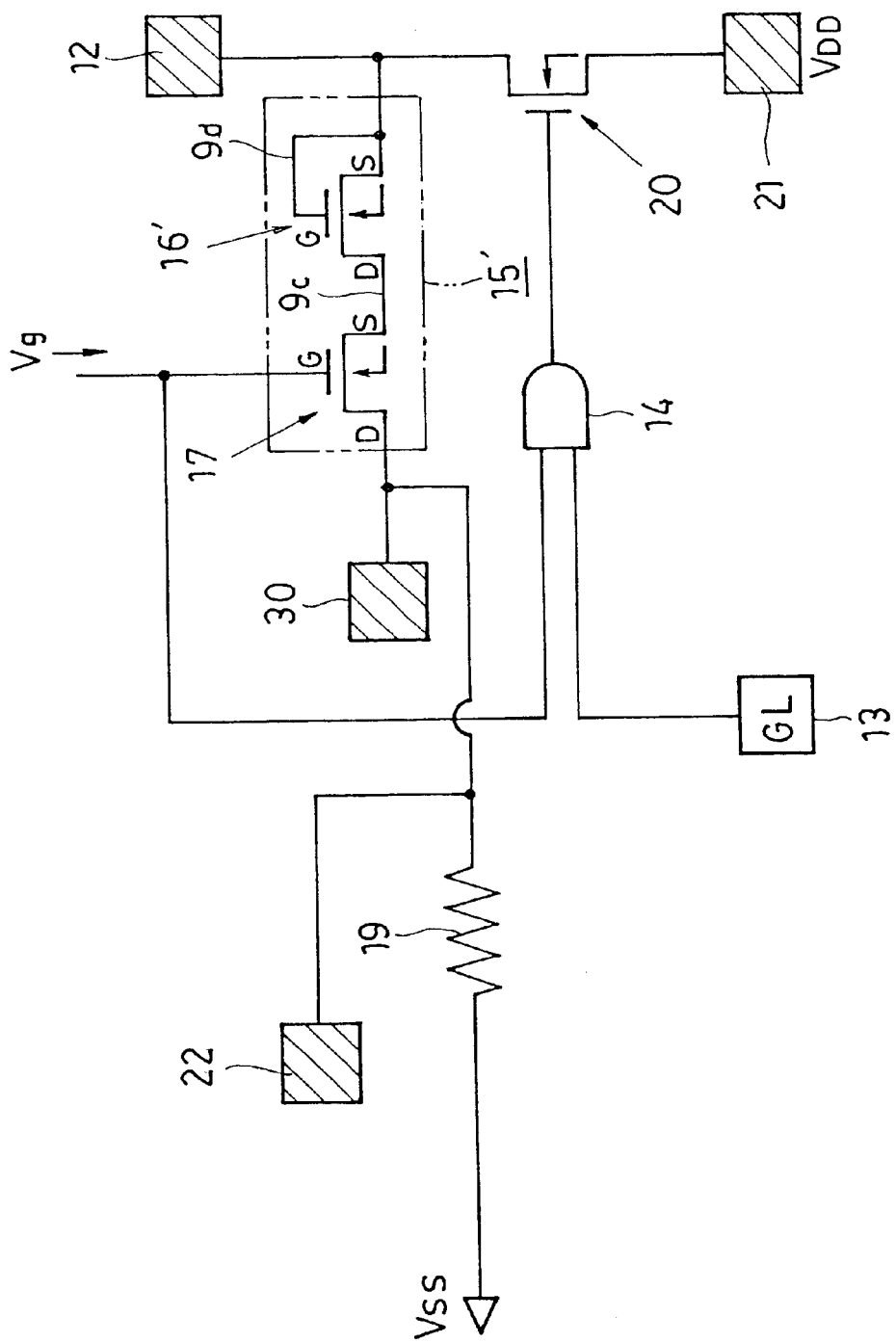
FIG. 6 is a circuit structure showing an outline of the method of controlling the semiconductor nonvolatile memory device shown in FIG. 4.

Second embodiment: FIG. 4 to FIG. 6

Next, the second embodiment of the present invention will be explained with reference to FIG. 4 to FIG. 6. In FIG. 4 and FIG. 6, the same numerals and symbols correspond to the portions corresponding to these in FIG. 1 and FIG. 3, and the explanation thereof will be omitted.

FIG. 4 is a cross sectional schematic view showing the second embodiment of the semiconductor nonvolatile memory device according to the present invention. The aspect in which the semiconductor nonvolatile memory device 15' differs from the semiconductor nonvolatile memory device 15 of the first embodiment shown in FIG. 1 is only that a gate electrode 6a of a memory transistor 16' and a source region 11a are connected with a interconnecting metal 9d.

FIG. 5 is a chart showing the change of the drain current in relation to the drain voltage of each transistor in a state such that a gate voltage is not applied on the memory transistor 16' and the gate voltage is applied on the address transistor 17. The solid line indicates the drain current in relation to the drain voltage of the memory transistor and the broken line indicates the drain current in relation to the drain voltage of the address transistor, and the dashed line shows a level of the drain current which comes to a break down of the memory transistor.

Since the memory transistor is in an off-state at this time, the drain current seldom passes through until the drain voltage reaches 8V, and when more voltage of the drain voltage is applied, the drain current starts passing through rapidly. When the drain voltage reaches about 9V, the drain current of about 100 mA passes through causing the breakdown. The address transistor does not reach the breakdown even the drain current of about 100 mA, that is a value exceeding the saturation current, is passed through for a short period of time.

Accordingly, with the semiconductor nonvolatile memory device 15' of the present embodiment, by applying voltage of about 10V, necessary to break down the memory transistor 16', on the drain of the address transistor 17 for a short period of time of about 100 msec to break down the memory transistor 16', while a predetermined voltage is applied on the gate electrode 6b of the address transistor 17, writing of a program can be performed.

FIG. 6 shows a configuration of a semiconductor device on which the semiconductor nonvolatile memory device 15' of the second embodiment is mounted. This is a similar circuit diagram to that in FIG. 3.

In this case, only an aspect wherein the gate G and the source S of the memory transistor 16' of the semiconductor nonvolatile memory device 15' are connected with a interconnecting metal 9d, and voltage is not applied on the gate G at the time of writing a program, and the memory transistor 16' is in an off-state, is different from the case in the first embodiment explained with reference to FIG. 3.

The method of writing a program and the check method of the writing result are the same as those in the case of the first embodiment, so the explanation thereof will be omitted.

It should be noted that when breakdown of the memory transistor 16' checked after the writing of a program, since voltage $V_{DD}$ applied on the read-only terminal 21 is applied on the gate G of the memory transistor 16' through the transistor switch 20 for reading, the memory transistor 16' is in an on-state in the case when the memory transistor 16' is not broken down.

When the surface impurity concentration of the first P-well 2a, which provides the memory transistor 16 mounted on the semiconductor substrate 1 shown in FIG. 4, and the second P-well, which provides the address transistor 17, are equal, the resistance value of the memory transistor 16' is several kilo ohms before breakdown and several ohms after breakdown in an on-state. However, the resistance value of the memory transistor 16' in an on-state can be controlled by changing the surface impurity concentration of the first P-well 2a which provides the memory transistor 16'.

When the surface impurity concentration of the first P-well 2a which provides the memory transistor 16' is thickend, the resistance value in an on-state before breakdown of the memory transistor 16' becomes high, so that the difference in the resistance value before and after writing of a program can be made larger.

Thus, since the sum of each resistance value of the address transistor 17, the transistor switch 20 for reading and the memory transistor 16' differs largely before and after writing of a program, signal detection for checking if the program is written in or not can be more certain.

This is the same as in the case of the first embodiment described above.

In each embodiment described above, in which the semiconductor nonvolatile memory device, which is provided with a hybrid element device as the memory transistor and the address transistor which are both n-type MOS transistors, is explained, it is needless to say that the memory transistor and the address transistor can be configured with p-type MOS transistors.

Effect of the Invention

As explained above, the semiconductor nonvolatile memory device according to the present invention makes it possible to carry out writing without making the size of the address transistor so large, and breaks down the memory transistor by supplying the current having sufficient intensity to break down the memory transistor.

As a result, by providing the memory transistor in the semiconductor nonvolatile memory device for DF adjustment interconnection in a timepiece, it becomes unnecessary to provide the same number of the input/output terminals as the number of the memory element devices, and a real superiority becomes extremely high when compared with the conventional DF adjustment circuit.

Furthermore, since it becomes possible to electrically carry out the writing of a program, the time required for the program writing process is substantially reduced compared with the conventional writing by a mechanical cutting means using a drill and the like.

What is claimed is:

1. A semiconductor nonvolatile memory device, comprising;

a semiconductor substrate;

a first well and a second well provided on the same face side of the semiconductor substrate;

a field oxidation film provided on said semiconductor substrate, and separately forming a first device region in said first well, and a second device region in said second well;

a memory transistor for writing a program, provided in said first device region;

an address transistor controlling the writing of said memory transistor provided in said second device region; and an interconnecting metal connecting a source region of said address transistor and a drain region of said memory transistor.

2. The semiconductor nonvolatile memory device according to claim 1, wherein surface impurity concentration of said first well is higher than surface impurity concentration of said second well.

3. The semiconductor nonvolatile memory device according to claim 1, wherein a channel area of a gate electrode of said memory transistor is smaller than a channel area of a gate electrode of said address transistor.

4. The semiconductor nonvolatile memory device according to claim 3, wherein a channel width of the gate electrode of said memory transistor is narrower than a channel width of the gate electrode of said address transistor.

5. The semiconductor nonvolatile memory device according to claim 3, wherein a channel length of the gate electrode of said memory transistor is shorter than the channel width of the gate electrode of said address transistor.

6. The semiconductor nonvolatile memory device according to claim 1, wherein said memory transistor is connected the gate electrode and the source region through the interconnecting metal.

7. The semiconductor nonvolatile memory device according to claim 6, wherein surface impurity concentration of said first well is thicker than surface impurity concentration of said second well.

8. The semiconductor nonvolatile memory device according to claim 6, wherein a channel area of a gate electrode of said memory transistor is smaller than a channel area of a gate electrode of said address transistor.

9. The semiconductor nonvolatile memory device according to claim 8, wherein a channel width of the gate electrode of said memory transistor is narrower than a channel width of the gate electrode of said address transistor.

10. The semiconductor nonvolatile memory device according to claim 8, wherein a channel length of the gate electrode of said memory transistor is shorter than the channel width of the gate electrode of said address transistor.

11. A method of writing a program to a semiconductor nonvolatile memory device to perform writing a program only once by electrically breaking down a memory transistor, comprising the steps of:

providing a first well and a second well on the same face side of a semiconductor substrate;

forming a first device region in the first well and a second device region in the second well separated by a field oxidation film provided respectively on said semiconductor substrate;

providing a memory transistor for writing a program in the first device region;

providing an address transistor controlling the writing of said memory transistor in the second device region; and using a semiconductor nonvolatile memory device in which a source region of said address transistor and a drain region of said memory transistor are connected by an interconnecting metal.

12. The method of writing to the semiconductor nonvolatile memory device according to claim 11, wherein the current in the range larger than the saturation current value but not so large as to break down said transistor is passed to said address transistor at the time of writing a program.

13. The method of writing to the semiconductor nonvolatile memory device according to claim 11, wherein the writing of a program is performed by simultaneously applying the same voltage on a gate electrode of said memory transistor and a gate electrode of said address transistor and electrically breaking down said memory transistor.

* * * * *